United States Patent
Ehm et al.

(10) Patent No.: US 10,649,340 B2
(45) Date of Patent: May 12, 2020

(54) REFLECTIVE OPTICAL ELEMENT FOR EUV LITHOGRAPHY

(71) Applicant: Carl Zeiss SMT GmbH, Oberkochen (DE)

(72) Inventors: Dirk Heinrich Ehm, Beckingen (DE); Vitaliy Shklover, Koenigsbronn (DE); Irene Ament, Aalen (DE); Stefan-Wolfgang Schmidt, Aalen (DE); Moritz Becker, Aalen (DE); Stefan Wiesner, Lauchheim (DE); Diana Urich, Munich (DE); Robert Meier, Munich (DE); Ralf Winter, Schwaebisch Gmuend (DE); Christof Jalics, Heidenheim (DE); Holger Kierey, Aalen (DE); Eric Eva, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/257,811

(22) Filed: Jan. 25, 2019

(65) Prior Publication Data

US 2019/0171108 A1 Jun. 6, 2019

Related U.S. Application Data

(63) Continuation of application No. PCT/EP2017/068061, filed on Jul. 17, 2017.

(30) Foreign Application Priority Data

Jul. 27, 2016 (DE) .................. 10 2016 213 831

(51) Int. Cl.
*G03F 7/20* (2006.01)
*G02B 5/08* (2006.01)
*G21K 1/06* (2006.01)

(52) U.S. Cl.
CPC .......... *G03F 7/702* (2013.01); *G02B 5/0891* (2013.01); *G03F 7/70033* (2013.01);
(Continued)

(58) Field of Classification Search
CPC ... G02B 5/0891; G03F 7/70033; G03F 7/702; G03F 7/70316; G03F 7/70916;
(Continued)

(56) References Cited

U.S. PATENT DOCUMENTS 6,780,496 B2 * 8/2004 Bajt ................. B82Y 10/00
428/216
7,183,602 B2 2/2007 Udayakumar et al.
(Continued)

FOREIGN PATENT DOCUMENTS

DE 102008042212 A1 4/2010
DE 102011015141 A1 9/2012
(Continued)

OTHER PUBLICATIONS

"Research Disclosure", Kenneth Mason Publications, vol. 586, No. 33, Feb. 1, 2013, 9 pages.
(Continued)

*Primary Examiner* — Steven Whitesell Gordon
(74) *Attorney, Agent, or Firm* — Edell, Shapiro & Finnan, LLC (57) ABSTRACT

In order to prevent delamination of a reflective coating from the substrate under the influence of reactive hydrogen, a reflective optical element (50) for EUV lithography is provided, which has a substrate (51) and a reflective coating (54) for reflecting radiation in the wavelength range of 5 nm to 20 nm. A functional layer (60) is arranged between the reflective coating (54) and the substrate (51). With the functional layer, the concentration of hydrogen in atom % at
(Continued)

the side of the substrate facing the reflective coating is reduced by at least a factor of 2.

18 Claims, 8 Drawing Sheets

(52) U.S. Cl.
CPC ...... *G03F 7/70316* (2013.01); *G03F 7/70916* (2013.01); *G03F 7/70925* (2013.01); *G03F 7/70958* (2013.01); *G03F 7/70983* (2013.01); *G21K 1/062* (2013.01); *G21K 2201/067* (2013.01)

(58) Field of Classification Search
CPC .............. G03F 7/70925; G03F 7/70958; G03F 7/70983; G21K 1/062
See application file for complete search history.

(56) References Cited

U.S. PATENT DOCUMENTS

| | | | |
|---|---|---|---|
| 7,217,940 | B2 | 5/2007 | Partlo et al. |
| 2004/0174624 | A1* | 9/2004 | Weiser ................... B82Y 10/00 359/883 |
| 2011/0228234 | A1* | 9/2011 | Von Blanckenhagen ................... B82Y 10/00 353/98 |
| 2012/0013976 | A1* | 1/2012 | Weber ................... G02B 1/1050 359/360 |
| 2013/0057952 | A1* | 3/2013 | Risse ................... C23C 14/024 359/360 |
| 2013/0170056 | A1* | 7/2013 | Ekstein ................ G02B 5/0808 359/838 |
| 2013/0335816 | A1* | 12/2013 | Kierey ................... B24B 13/00 359/359 |
| 2014/0098413 | A1* | 4/2014 | Ershov ................. G02B 5/0891 359/359 |
| 2014/0199543 | A1* | 7/2014 | Ehm ...................... G02B 1/105 428/336 |
| 2016/0012929 | A1* | 1/2016 | Kuznetsov ............. G21K 1/062 250/505.1 |
| 2016/0154317 | A1 | 6/2016 | Hermann |
| 2017/0160639 | A1 | 6/2017 | Ehm et al. |

FOREIGN PATENT DOCUMENTS

| | | |
|---|---|---|
| DE | 102013102670 A1 | 10/2014 |
| DE | 102013215541 A1 | 2/2015 |
| DE | 102016224200 A1 | 6/2018 |
| EP | 1333323 A2 | 8/2003 |
| WO | 02054115 A2 | 7/2002 |
| WO | 2008148516 A2 | 12/2008 |
| WO | 2010031483 A1 | 3/2010 |
| WO | 2012123436 A1 | 9/2012 |
| WO | 2012136420 A1 | 10/2012 |
| WO | 2012156394 A1 | 11/2012 |
| WO | 2012175494 A1 | 12/2012 |
| WO | 2014139694 A1 | 9/2014 |
| WO | 2015117887 A1 | 8/2015 |
| WO | 2016023840 A1 | 2/2016 |
| WO | 2017123323 A1 | 7/2017 |

OTHER PUBLICATIONS

GPTO Office Action with English Translation, DE 10 2016 213 831.6, dated Mar. 23, 2017, 10 pages.
International Search Report, PCT/EP2017/068061, dated Oct. 13, 2017, 6 pages.
PCT International Preliminary Report on Patentability, PCT/EP2017/068061, dated Jan. 29, 2019, 7 pages.

* cited by examiner

REFLECTIVE OPTICAL ELEMENT FOR EUV LITHOGRAPHY

CROSS REFERENCE TO RELATED APPLICATIONS

This is a Continuation of International Application PCT/EP2017/068061, which has an international filing date of Jul. 17, 2017, and which claims the priority of German Patent Application 10 2016 213 831.6, filed Jul. 27, 2016. The disclosures of both applications are incorporated in their respective entireties into the present Continuation by reference.

BACKGROUND

The present invention relates to a reflective optical element for EUV lithography, comprising a substrate and a reflective coating for reflecting radiation in the wavelength range of 5 nm to 20 nm. Furthermore, it relates to an optical system for an EUV lithography apparatus and to an EUV lithography apparatus having such a reflective optical element.

FIELD OF THE INVENTION

In EUV lithography apparatuses, for the lithography of semiconductor components, use is made of reflective optical elements for the extreme ultraviolet (EUV) wavelength range (e.g. wavelengths between approximately 5 nm and 20 nm) such as, for instance, photomasks or mirrors on the basis of multilayer systems for quasi-normal incidence or mirrors having a metallic surface for grazing incidence. Since EUV lithography apparatuses generally have a plurality of reflective optical elements, they must have as high a reflectivity as possible to ensure sufficiently high overall reflectivity. The reflectivity and the lifetime of the reflective optical elements may be reduced by contamination of the optically used reflective surface of the reflective optical elements, which arises on account of the short-wave irradiation together with residual gases in the operating atmosphere. Since a plurality of reflective optical elements are usually arranged one behind another in an EUV lithography apparatus, even relatively small contaminations on each individual reflective optical element affect the overall reflectivity to a relatively great extent.

Contamination can occur for example on account of high hydrogen partial pressures. In this case, water molecules are cleaved by the EUV radiation and the resulting oxygen radicals oxidize the optically active surfaces of the reflective optical elements. A further contamination source is hydrocarbon molecules which can originate for example from the vacuum pumps used in EUV lithography apparatuses or from residues of photoresists which are used on the semiconductor substrates to be patterned and which, under the influence of the operating radiation, lead to carbon contaminations on the reflective optical elements. In the case of collector mirrors used in conjunction with a plasma laser source, the material which is excited to form a plasma, for example tin, occurs as an additional contamination source. While oxidative contaminations are generally irreversible, in particular carbon contaminations and possibly tin can be removed inter alia by treatment with reactive hydrogen, by virtue of the reactive hydrogen reacting therewith to form volatile compounds. Reactive hydrogen can be hydrogen radicals or else ionized hydrogen atoms or molecules.

It has been observed, however, that under the influence of reactive hydrogen which is used for cleaning or which can arise on account of the interaction of the EUV radiation with molecular hydrogen present in the residual atmosphere, blistering and even detachment of the reflective coating can occur. Macroscopic blistering or delamination is observed in particular in the case of collector mirrors, which are especially exposed to reactive hydrogen compared with other reflective optical elements of an EUV lithography apparatus.

The delamination is presumably caused by the penetration of reactive hydrogen into the reflective coating, in particular at mechanical defects or defects that occurred during the coating. The indiffused reactive hydrogen can recombine to form molecular hydrogen and thus lead to blistering and, in the worst case, breaking up or peeling of the reflective coating. Damaged locations of this type have a high reflection in the infrared wavelength range. This is harmful particularly in the case of collector mirrors. This is because the highest thermal load occurs in the case of collector mirrors, inter alia on account of the infrared lasers that can be used in the radiation source, and upon reflection of the thermal radiation in the direction of the beam path of the EUV lithography apparatus it is possible, in particular, for the downstream reflective optical elements to be damaged.

One approach for combating the hydrogen-dictated delamination effect consists in providing a protective layer system against reactive hydrogen on the reflective coating, as proposed for example in WO 2014/139694 A1.

SUMMARY

It is an object of the present invention to propose a different reflective optical element for EUV lithography in which the risk of breaking up or peeling of the reflective coating is reduced.

This object is achieved with a reflective optical element for EUV lithography, comprising a substrate and a reflective coating for reflecting radiation in the wavelength range of 5 nm to 20 nm, and wherein a functional layer is arranged between the reflective coating and the substrate. With this functional layer, the concentration of hydrogen in atom % at the side of the substrate facing the reflective coating is reduced by at least a factor of 2.

It has been found that a functional layer between substrate and reflective coating which reduces the concentration of hydrogen in atom % at the side of the substrate facing the reflective coating by at least a factor of 2, compared with the corresponding reflective optical element without this functional layer, can reduce the probability of breaking up or delamination of the reflective coating as a whole. Preferably, the hydrogen concentration is reduced by a factor of at least 5, particularly preferably of at least 10, very particularly preferably of at least 50, and extremely particularly preferably of at least 100. The functional layer acts as it were as a type of diffusion barrier for reactive hydrogen, thereby suppressing recombination of reactive hydrogen to form molecular hydrogen below the reflective coating.

In particular, the risk of delamination is also reduced in the case of reflective optical elements comprising a protective layer system against reactive hydrogen on the reflective coating. This is because it has been found that in particular at defects in the protective layer system and/or in the reflective coating, reactive hydrogen can indiffuse to a depth such that there remains a non-negligible residual risk of delamination of the reflective coating from the substrate. This can be reduced further, however, by the functional layer proposed here.

Coating should be understood to mean both coatings on the basis of multilayer systems which are suitable particularly for normal and quasi-normal incidence and are based on Bragg reflection, and coatings having only one or a few layers which are suitable for grazing incidence and are based on total internal reflection. It should be pointed out that the reflective optical element having a functional layer can comprise exactly one functional layer or two or three or more functional layers.

In preferred embodiments, the functional layer comprises one or more of the materials of the group tin, silver, molybdenum, ruthenium, iridium, nickel, iron, cobalt, copper, aluminum, platinum, zinc, manganese, lead, gold, palladium, tungsten, tantalum, alloys, oxides, borides, nitrides and carbides thereof. Particularly preferably, the functional layer comprises tin oxide or tin nitride. In the case of reflective optical elements comprising functional layers of this type, breaking up or delamination of the reflective coating as a whole can be observed less often.

In preferred embodiments, the functional layer is configured as a microstructured layer. Said microstructured layer serves to direct radiation from undesired wavelength ranges such as infrared or ultraviolet, for instance, out of the beam path in order to avoid erroneous exposures, to reduce the thermal load on the reflective optical elements disposed downstream in the beam path and to avoid other damage in an EUV lithography apparatus. To that end, it is structured in such a way that the radiation from undesired wavelength ranges can be suppressed by destructive interference. By way of example, it can be configured as a diffraction grating.

In other variants, a separate microstructured layer is provided, which is arranged between the reflective coating and the substrate. As a result, it can be optimized in a more targeted manner for the purpose of spectral filtering.

Preferably, the microstructured layer in these other variants comprises one or more materials of the group nickel-phosphorus, nickel-boron, copper, silver, gold, platinum, iridium, tantalum, titanium, zirconium, tungsten, molybdenum and niobium. These materials can be applied with sufficiently large thicknesses of a few hundred micrometers and be structured well.

Advantageously, in these other variants, the functional layer is arranged between the reflective coating and the microstructured layer in order to reduce the risk of delamination of the reflective coating not just from the substrate but from the microstructured layer. Optionally, the functional layer can also or additionally be arranged between substrate and microstructured layer in order as far as possible to avoid delamination at the substrate. A further alternative or additional advantageous option consists in providing the functional layer within the microstructured layer.

In preferred embodiments, a polishing layer is arranged on the functional layer or the substrate or the microstructured layer or the functional layer configured as a microstructured layer. In order to achieve good imaging properties, in the case of reflective optical elements for EUV lithography it is advantageous if the reflective coating has a root-mean-square roughness (also referred to as RMS roughness) in the spatial frequency range of 0.1 µm to 200 µm of not more than 0.5 nm, preferably not more than 0.25 nm. To that end, the surface on which the reflective coating is applied should also have a comparable low roughness. Particularly preferably, the polishing layer in said spatial frequency range has an RMS roughness of not more than 0.2 nm.

Layers composed of readily polishable material are particularly suitable as polishing layers in these preferred embodiments. Advantageously, the polishing layer comprises one or more materials of the group amorphous silicon, silicon dioxide, silicon nitride, gallium nitride and aluminum nitride. Amorphous silicon is able to be applied by customary physical and chemical vapor deposition methods (PVD and CVD methods) and can be polished to the abovementioned degrees of roughness via standard polishing methods. Silicon dioxide, silicon nitride, gallium nitride and aluminum nitride as polishing layer material are likewise suitable for achieving an RMS roughness of not more than 0.2 nm in the spatial frequency range of 0.1 µm to 200 µm and for being applied by customary PVD and CVD methods.

Preferably, in these preferred embodiments, the functional layer is arranged between the polishing layer and the reflective coating. This is advantageous in particular in the case of polishing layers which comprise amorphous silicon or else silicon dioxide or silicon nitride. This is because silicon has comparatively high recombination rates of reactive hydrogen to form molecular hydrogen and thus an increased risk of the accumulation of hydrogen gas at the interface between polishing layer and reflective coating. In this regard, the functional layer at said interface can manifest its effect particularly well and suppress delamination of the reflective coating by reducing the hydrogen concentration.

In preferred embodiments, the substrate comprises one or more of the materials of the group silicon, silicon carbide (SiSiC), silicon-infiltrated silicon carbide, quartz glass, titanium-doped quartz glass, glass, glass ceramic. In the case of these substrate materials, a relatively high recombination rate of reactive hydrogen to form molecular hydrogen can be observed, such that the functional layer can manifest its effect particularly well and suppress delamination at the interface with the substrate. Furthermore, the substrate can also be composed of copper, aluminum, a copper alloy, an aluminum alloy or a copper-aluminum alloy.

In preferred embodiments, an adhesion promoter layer is arranged on the substrate, said adhesion promoter layer consisting of at least one ply and comprising one or more materials of the group consisting of ruthenium, chromium, platinum, iridium, copper, silver, gold, nickel, nickel-phosphorus, tantalum, titanium, zirconium, tungsten, molybdenum and niobium. As a result, it is possible to increase the adhesion below the reflective coating and thus additionally to reduce the probability of delamination of the reflective coating.

In preferred embodiments, the reflective coating is configured as a multilayer system comprising alternately arranged layers of a material having a lower real part of the refractive index at an operating wavelength in the wavelength range of between 5 nm and 20 nm and of a material having a higher real part of the refractive index at an operating wavelength in the wavelength range of between 5 nm and 20 nm. Reflective optical elements of this type are particularly suitable for use for normal or quasi-normal incidence.

Particularly preferably, the reflective optical element for EUV lithography is configured as a collector mirror. Particularly if they are operated as collector mirrors together with plasma radiation sources on the basis of tin, for example, they are exposed particularly often and to high concentrations of reactive hydrogen for cleaning purposes. In the case of collector mirrors, the anti-delamination effect of the functional layer can be manifested particularly clearly.

Furthermore, the object is achieved with an optical system for an EUV lithography apparatus having a reflective optical element as described above, and an EUV lithography apparatus having such an optical system or such a reflective optical element.

The present invention will be explained in more detail with reference to preferred exemplary embodiments. In the figures:

DETAILED DESCRIPTION

Figure 1:
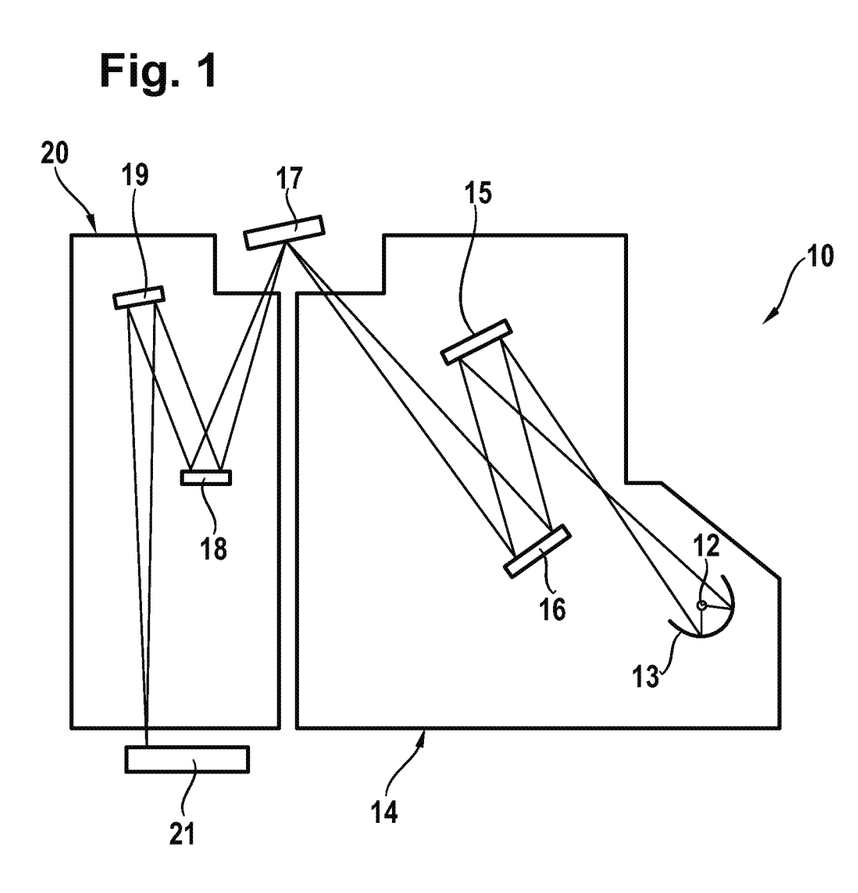
FIG. 1 schematically shows one embodiment of an EUV lithography apparatus having reflective optical elements.

FIG. 1 schematically shows an EUV lithography apparatus 10. Basic components thereof are the illumination system 14, the photomask 17 and the projection system 20. The EUV lithography apparatus 10 is operated under vacuum conditions so that the EUV radiation in the interior thereof is absorbed as little as possible.

A plasma source or a synchrotron can serve for example as the radiation source 12. In the example illustrated here, a plasma source is used. The emitted radiation in the wavelength range of approximately 5 nm to 20 nm is firstly focused by the collector mirror 13. The operating beam is then introduced into the illumination system 14. In the example illustrated in FIG. 1, the illumination system 14 has two mirrors 15, 16. The mirrors 15, 16 guide the beam onto the photomask 17 having the structure which is intended to be imaged onto the wafer 21. The photomask 17 is likewise a reflective optical element for the EUV and soft X-ray wavelength range, which is exchanged depending on the production process performed. With the aid of the projection system 20, the beam reflected from the photomask 17 is projected onto the wafer 21 and the structure of the photomask is thereby imaged onto said wafer. In the example illustrated, the projection system 20 has two mirrors 18, 19. It should be pointed out that both the projection system 20 and the illumination system 14 can instead have, respectively, only one or as many as three, four, five or more mirrors.

In the example illustrated here, the collector mirror 13 is a mirror 50 for quasi-normal incidence, the reflective coating of which is based on a multilayer system 54, as illustrated schematically in FIGS. 2 to 8. This involves alternately applied layers of a material having a higher real part of the refractive index at the operating wavelength at which for example the lithographic exposure is carried out (also called spacer 56) and of a material having a lower real part of the refractive index at the operating wavelength (also called absorber 57), wherein an absorber-spacer pair forms a stack 55. In certain respects a crystal is thereby simulated whose lattice planes correspond to the absorber layers at which Bragg reflection takes place. The thicknesses of the individual layers 56, 57 and also of the repeating stacks 55 can be constant over the entire multilayer system 54 or vary, depending on what spectral or angle-dependent reflection profile is intended to be achieved. The reflection profile can also be influenced in a targeted manner by the basic structure composed of absorber 57 and spacer 56 being supplemented by further more and less absorbent materials in order to increase the possible maximum reflectivity at the respective operating wavelength. To that end, in some stacks absorber and/or spacer materials can be mutually interchanged or the stacks can be constructed from more than one absorber and/or spacer material. The absorber and spacer materials can have constant or varying thicknesses over all the stacks in order to optimize the reflectivity. Furthermore, it is also possible to provide additional layers as diffusion barriers between spacer and absorber layers 56, 57. A material combination that is customary for example for an operating wavelength of 13.4 nm is molybdenum as absorber material and silicon as spacer material. In this case, a stack 55 usually has a thickness of 6.7 nm, wherein the spacer layer 56 is usually thicker than the absorber layer 57.

In the example illustrated here, the reflective coating 54 also has a protective layer 53, which can also consist of more than one ply. By way of example, in the case of a molybdenum-silicon multilayer system, the protective layer 53 can be constructed, inter alia, from a ply of silicon nitride and a ply of ruthenium as termination with respect to the vacuum. By way of example, a protective layer system as described in WO 2014/139694 A1 can also be involved. The reflective coating 54 is arranged on a substrate 51. Typical substrate materials for reflective optical elements for EUV lithography, in particular collector mirrors, are silicon, silicon carbide, silicon-infiltrated silicon carbide, quartz glass, titanium-doped quartz glass, glass and glass ceramic. Furthermore, the substrate can also be composed of copper, aluminum, a copper alloy, an aluminum alloy or a copper-aluminum alloy.

In a variant that is not illustrated here, the collector mirror can also be configured as a mirror for grazing incidence. To that end, by way of example, on a substrate composed of a copper or aluminum alloy, said collector mirror can comprise a polishing layer composed, inter alia, of nickel-phosphorus or amorphous silicon and thereabove a ruthenium layer as reflective coating. Optionally, said collector mirror can additionally comprise a microstructured layer in order for example to filter out ultraviolet or infrared radiation from the beam path.

In the example illustrated here, the radiation source can be a plasma radiation source in which tin droplets are excited by a $CO_2$ laser to form a plasma that emits radiation in the EUV wavelength range. In this case, tin can penetrate into the EUV lithography apparatus and deposit on, in particular, the surface of the collector mirror. In the case of the reflective optical elements disposed downstream in the beam path, the tin contamination is negligible and contamination on the basis of oxygen or carbon can primarily occur. In order to reduce in particular the tin and carbon contamination on the coatings of the reflective optical elements of an EUV lithography apparatus, they are operated in vacuo with an admixture of hydrogen at a low partial pressure. Under the influence of the EUV radiation, reactive hydrogen in the form of hydrogen radicals and hydrogen ions forms from the molecular hydrogen. Said hydrogen ions are largely converted into hydrogen radicals by wall collisions. The reactive hydrogen forms volatile tin and/or carbon compounds that can be extracted by pumping.

Particularly if the reflective coating contains defects that arose during operation or as early as during production, such as, for instance, pores, inclusions, dislocations or mechanical damage, such as scratches or cracks, for instance, penetration of reactive hydrogen into the reflective coating can be observed, said reactive hydrogen recombining inter alia below the reflective coating. The conversion into molecular hydrogen leads to an increase in volume. Blisters form below the reflective coating, which can lead to local peeling of part of or the entire reflective coating. A delamination appears to occur more frequently, primarily at interfaces with silicon plies or layers or silicon-containing plies or layers. Delaminated locations have a high reflectivity in the infrared range. This is problematic particularly in the case of collector mirrors if they are used in conjunction with a laser plasma radiation source from which owing to the laser, not only EUV radiation but also to an increased extent infrared radiation emerge. Should too much infrared radiation be coupled into the further beam path, the downstream mirrors and the photomask could be damaged.

Hitherto, reflective optical elements damaged by the influence of hydrogen to the effect that the reflective coating burst open or underwent spalling have had to be produced virtually anew by virtue of the need to completely remove the entire coating and coat the substrate anew. In the case of the exemplary embodiments presented below, the risk of a delamination of the reflective coating occurring is reduced. With no restriction of generality, in the examples illustrated in FIGS. 2 to 8, the reflective optical elements 50 for EUV lithography are collector mirrors for quasi-normal incidence.

Figure 2:
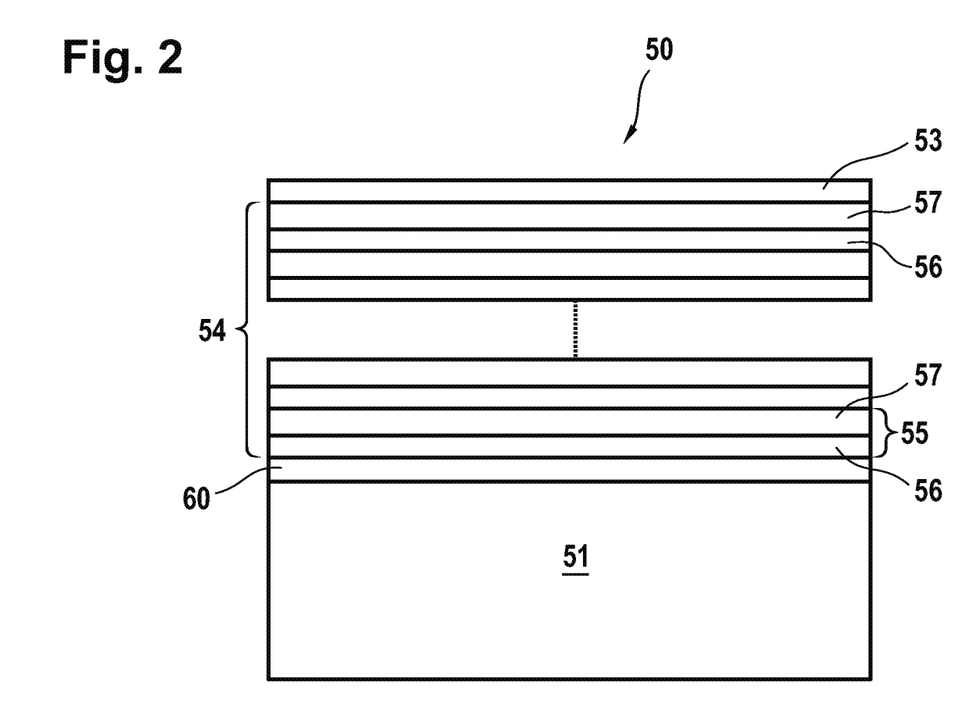
FIG. 2 schematically shows a first embodiment of a reflective optical element proposed here.

In the example illustrated in FIG. 2, a functional layer 60 is provided between the substrate 51 and the reflective coating 54. Said functional layer can be configured with one or more plies and comprises one or more materials of the group tin, silver, molybdenum, ruthenium, iridium, nickel, iron, cobalt, copper, aluminum, platinum, zinc, manganese, lead, gold, palladium, tungsten, tantalum, alloys, oxides, borides, nitrides and carbides thereof, in the case of which it has been observed that they can act as a diffusion barrier against reactive hydrogen and can reduce the concentration of hydrogen in atom % at the side of the substrate facing the reflective coating by at least a factor of 2, preferably of at least 5, particularly preferably of at least 10, very particularly preferably of at least 50, and extremely particularly preferably of at least 100, compared with an identical reflective optical element without this functional layer. In preferred cases, said functional layer consists of one ply composed of one of the materials mentioned. Advantageously, the material selection takes account of there being a good adhesion to the substrate and to the ply or layer lying above the functional layer and/or similar coefficients of thermal expansion being present.

Figure 3:
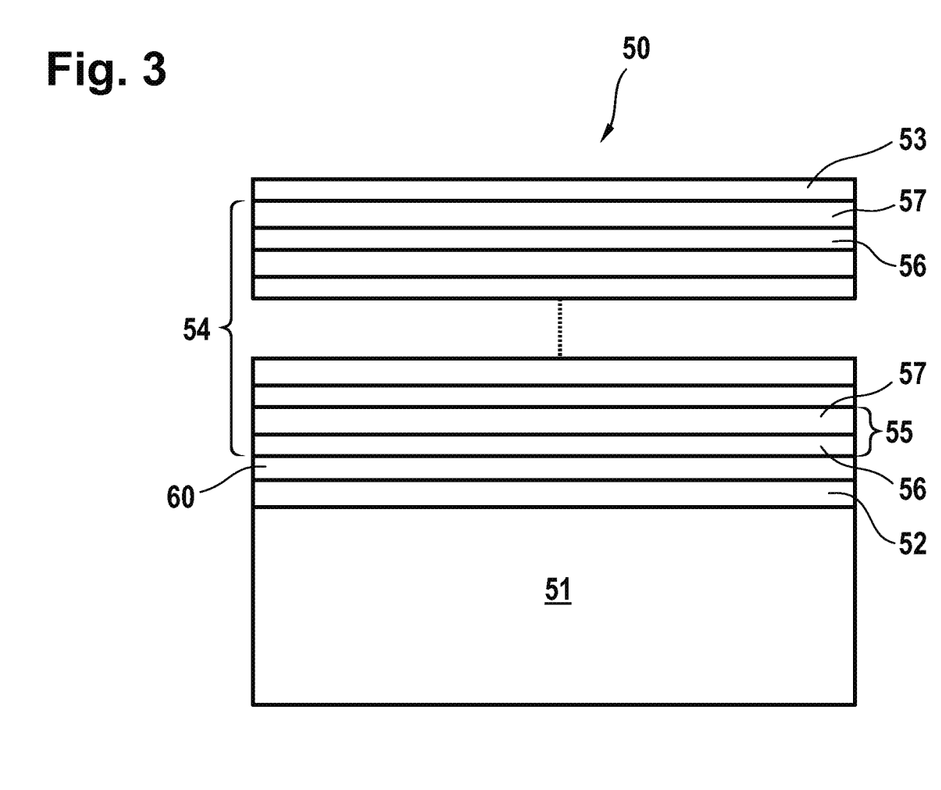
FIG. 3 schematically shows a second embodiment of a reflective optical element proposed here.

The example illustrated in FIG. 3 additionally comprises a polishing layer 52 between the functional layer 60 and the substrate 51. Said polishing layer is preferably composed of amorphous silicon, silicon dioxide, silicon nitride, gallium nitride or aluminum nitride and can be arranged not only on substrates composed of glass, glass ceramic, quartz glass, doped quartz glass, silicon, silicon carbide and silicon-infiltrated silicon carbide, but also on substrates composed of copper, aluminum or alloys thereof. Particularly preferably, a functional layer 60 composed of one ply of tin, tin oxide, tin nitride, ruthenium, iridium, nickel, iron, cobalt, copper, silver, aluminum or oxides, borides, nitrides and carbides thereof is applied on the polishing layer 52, particularly in the case of polishing layers composed of amorphous silicon.

Figure 4:
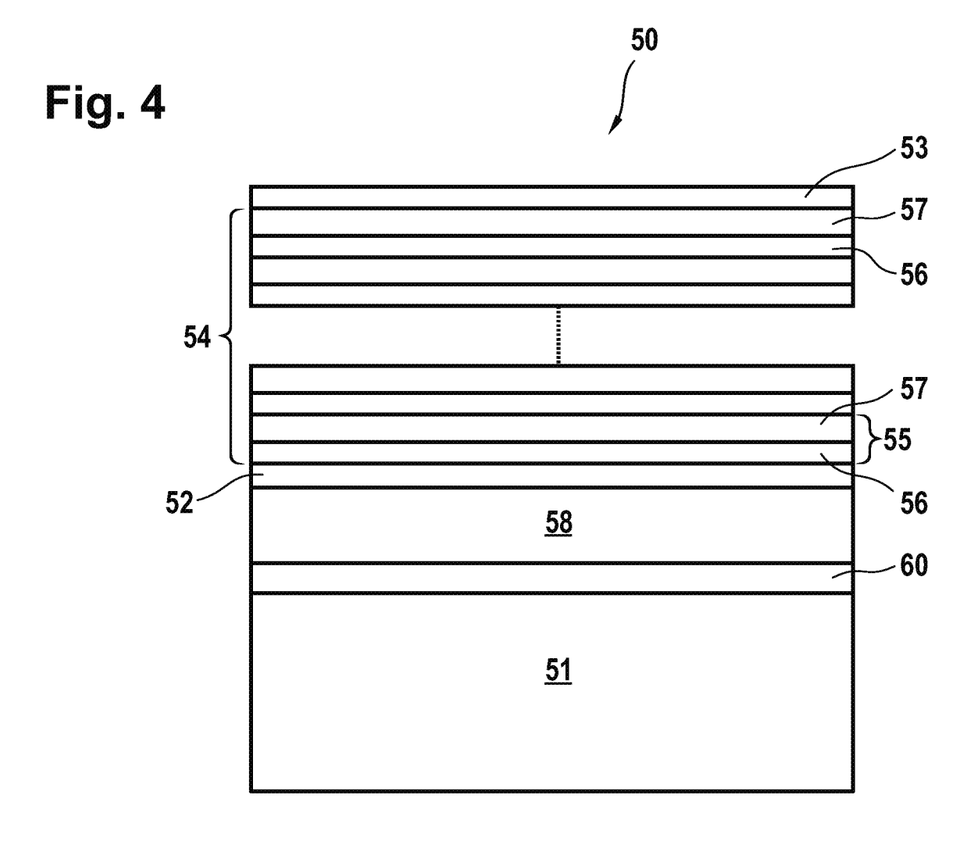
FIG. 4 schematically shows a third embodiment of a reflective optical element proposed here.

In the example illustrated in FIG. 4, a microstructured layer 58 is provided between substrate 51 and reflective coating 54. Said microstructured layer serves to filter radiation from undesired wavelength ranges such as, for instance, ultraviolet radiation that is likewise emitted by the radiation source 12 or the infrared radiation used to excite the plasma of the radiation source 12 from the beam path of the operating radiation in the EUV wavelength range through destructive interference. To that end, the microstructured layer 58 can have a diffraction grating structure, for example. In the present example, the microstructured layer 58 is composed of one or more materials of the group nickel-phosphorus, nickel-boron, copper, silver, gold, platinum, iridium, tantalum, titanium, zirconium, tungsten, molybdenum and niobium, preferably of nickel-phosphorus, nickel-boron, copper or silver, and has a thickness of a few to a few hundred micrometers. On the microstructured layer 58, a polishing layer 52 is arranged on the coating side, which polishing layer can however also be omitted in variants, and a functional layer 60 on the substrate side. The risk of delamination on account of hydrogen diffusion can thereby be reduced.

Figure 5:
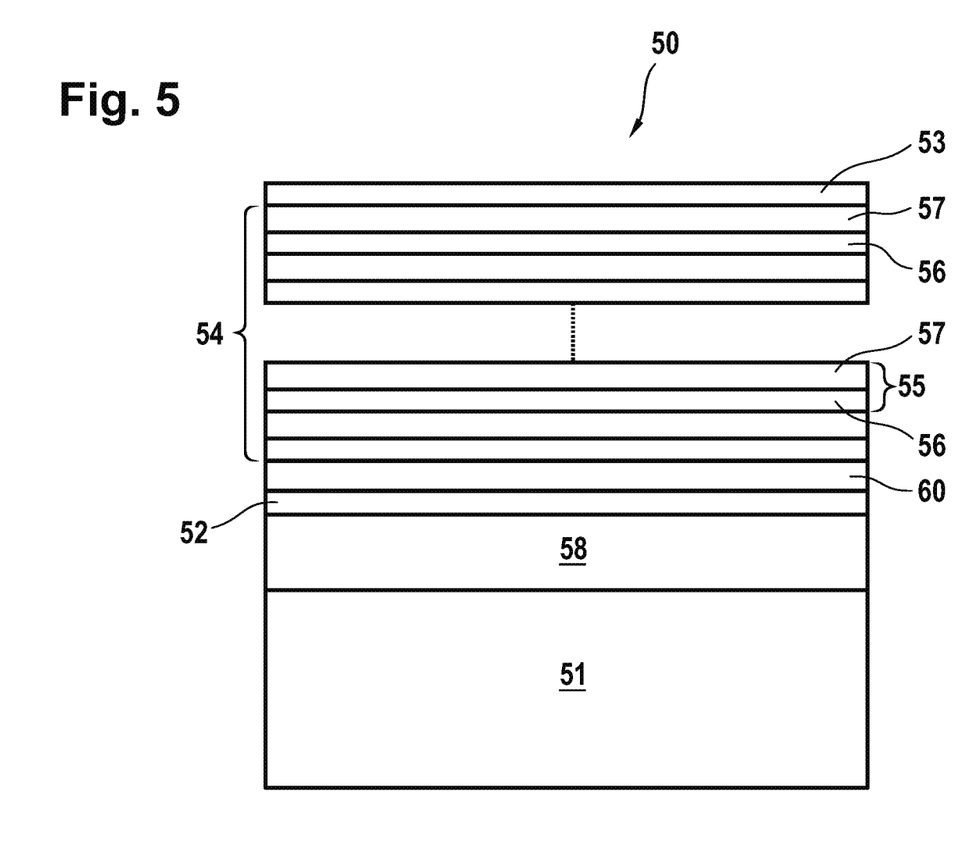
FIG. 5 schematically shows a fourth embodiment of a reflective optical element proposed here.

In the embodiment variant illustrated in FIG. 5, by contrast, the functional layer 60 is provided between the polishing layer 52, which is arranged on the microstructured layer 58, and the reflective coating 54. In this exemplary embodiment, the microstructured layer 58 is preferably tantalum, titanium, zirconium, tungsten, molybdenum and niobium, which promote a particularly good adhesion between metals such as are used for the microstructured layer 58 and substrates 51 composed of silicon, silicon carbide, silicon-infiltrated silicon carbide, quartz glass, titanium-doped quartz glass, glass, glass ceramic. The risk of delamination can additionally be reduced thereby. In modifications that are not illustrated, the adhesion effect also with respect to the reflective coating or, if appropriate, the polishing layer can be so high that a hydrogen-concentration-reducing functional layer can be dispensed with. In further modifications that are not illustrated, the polishing layer can also be dispensed with. Preferably, materials having good resistance to external mechanical influences are selected as materials for the functional layer 60 on a microstructured layer 58. Advantageously, they have a low intrinsic roughening as a result of coating processes and/or should enable a good covering of possible defects in the microstructured layer 58. It is also advantageous if it has a good adhesion to the microstructured layer 58 and the reflective coating 54. By way of example, palladium, tungsten and oxides such as tantalum oxide and aluminum oxide, for instance, are particularly suitable as materials for the functional layer 60 on a microstructured layer 58.

Figure 6:
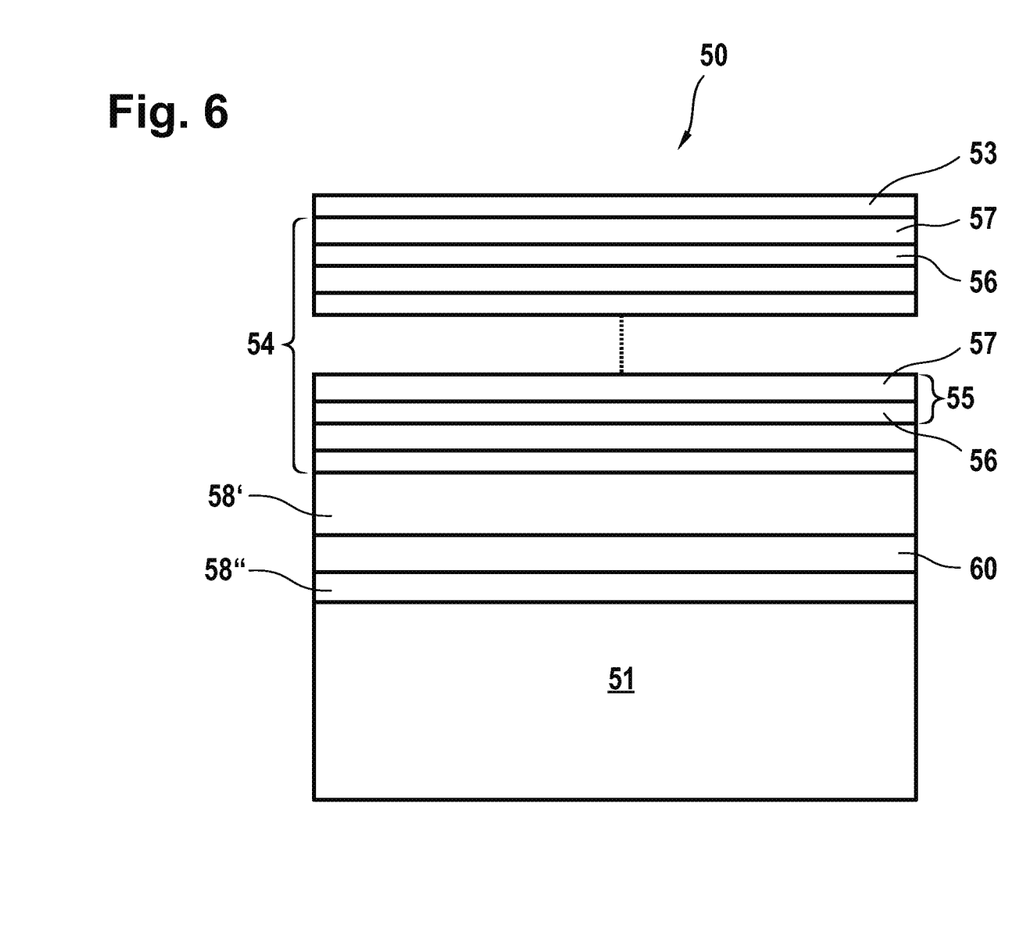
FIG. 6 schematically shows a fifth embodiment of a reflective optical element proposed here.

In the embodiment variant illustrated in FIG. 6, the functional layer 60 is arranged within the microstructured layer, which is divided into a microstructured sublayer 58' and a further sublayer 58" by the functional layer 60 in the present example. In this embodiment variant, the diffusion of hydrogen as far as the interface between substrate 51 and sublayer 58" and into the sublayer 58" is prevented as far as possible, particularly if the reflective coating in places is damaged or has defects.

Figure 7:
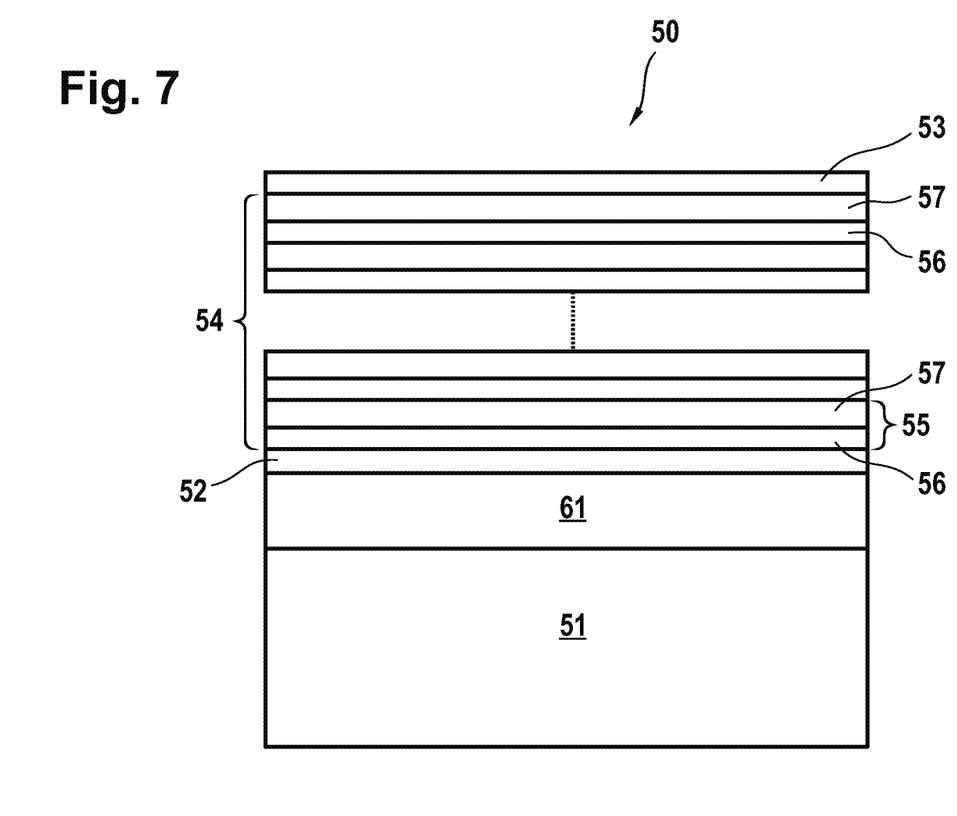
FIG. 7 schematically shows a sixth embodiment of a reflective optical element proposed here.
Figure 8:
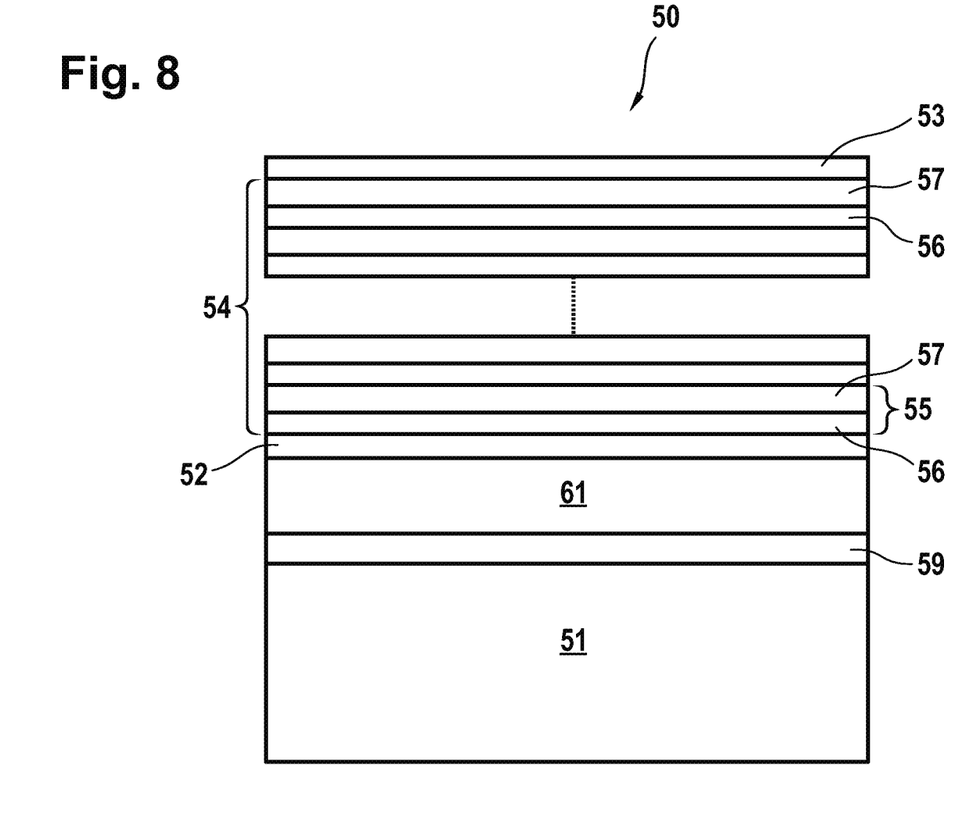
FIG. 8 schematically shows a seventh embodiment of a reflective optical element proposed here.

The two embodiment variants illustrated in FIGS. 7 and 8 have the special feature that the functional layer 61 is configured as a microstructured layer and comprises one or more of the materials of the group tin, silver, molybdenum, ruthenium, iridium, nickel, iron, cobalt, copper, aluminum, platinum, zinc, manganese, lead oxides, borides, nitrides and carbides thereof, preferably tin oxide and/or tin nitride. For this purpose, it has a thickness which is not just in the range of a few nanometers to micrometers, as in the case of the functional layers 60 discussed above, but rather of at least a few hundred micrometers. In order to apply it, use is preferably made of coating methods having particularly high deposition rates, such as e.g. atmospheric pressure plasma deposition, gas flow rate plasma deposition, vacuum arc plasma coating, electrodeposition from non-aqueous electrolytes or plasma-enhanced chemical vapor deposition (PE-CVD). For the production of the functional layers 60 discussed above, all other customary methods for physical or chemical vapor deposition can also be used, in particular sputtering methods or methods for electron beam evaporation.

In the embodiment illustrated by way of example in FIG. 7, the functional layer 61 embodied as a microstructured layer is embodied with one or more plies and arranged directly on the substrate 51.

In the embodiment illustrated by way of example in FIG. 8, the functional layer 61 embodied as a microstructured layer is preferably composed of ruthenium, iridium, nickel, iron, cobalt, copper, silver, aluminum or oxides, borides, nitrides and carbides thereof, and particularly preferably of tin, tin oxide or tin nitride, which appear to have a particularly good barrier effect against reactive hydrogen. In addition, an adhesion promoter layer 59 is provided between said layer 61 and the substrate 51 composed of silicon, silicon carbide, silicon-infiltrated silicon carbide, quartz glass, titanium-doped quartz glass, glass or glass ceramic, said adhesion promoter layer being embodied with one or two plies, preferably composed of ruthenium, iridium, platinum, copper, silver, gold, nickel, nickel-phosphorus, chromium, tantalum, titanium, zirconium, niobium, tungsten or molybdenum, which can additionally reduce the risk of delamination through an improved adhesion. Particularly preferably, the functional layer 62 has two plies comprising a ply composed of ruthenium, iridium, platinum, or copper facing away from the substrate and a substrate-side ply composed of chromium, tantalum, titanium, zirconium, niobium, tungsten or molybdenum. In order to improve the adhesion with or without an adhesion promoter layer 59, it may be beneficial to clean a layer surface, in particular that of the substrate 51, chemically before the next layer, in particular an adhesion promoter layer or the functional layer, is applied. Depending on the actual material selection, cleaning can be carried out, inter alia, using an alkaline substance such as, for instance, potassium hydroxide or sodium hydroxide or using an acidic substance such as, for instance, sulfuric acid or nitric acid.

It should be pointed out that the embodiments presented here can also be combined with one another.

Previous experience allows the expectation that the above-described mirrors with functional layer between reflective coating and substrate have an increased endurance against delamination of the reflective coating and also a hydrogen concentration in atom % at the side of the substrate facing the reflective coating that is reduced by at least a factor of 2.

In particular, the measurement methods of nuclei reaction analysis or elastic backscattering analysis are suitable for determining the hydrogen concentration in atom % at the side of the substrate facing the reflective coating. In this case, the hydrogen concentration of a mirror proposed here is compared with that of an identical mirror without the functional layer.

A particularly high endurance against hydrogen-dictated delamination of the reflective coating is expected, inter alia, for collector mirrors for EUV lithography in accordance with that described in conjunction with FIG. 7. Preferably, they comprise as reflective coating a multilayer system on the basis of alternating molybdenum and silicon layers as described above. As protective layer, they can have a zirconium nitride layer of a few nanometers. Preferably, a functional layer configured as a microstructured layer and composed of optionally in each case tin, tin oxide or tin nitride is arranged on a substrate composed of silicon-infiltrated silicon carbide. On said functional layer, toward the reflective coating, it is possible to arrange a polishing layer having a thickness of a few nanometers and composed of amorphous silicon with an RMS roughness of less than 0.2 nm in the spatial frequency range of 0.1 μm to 200 μm. Preferably, an adhesion promoter layer embodied with two plies is arranged between the substrate and the functional layer, said adhesion promoter layer comprising a chromium ply on the substrate side and a ruthenium ply thereabove, both having a thickness of a plurality of nanometers. Collector mirrors of this type are expected to exhibit hydrogen-generated delamination of the reflective coating from the substrate neither after a plurality of ex situ tin cleanings with cleaning rates of the order of magnitude of micrometers per hour with reactive hydrogen nor after 1500 h operation with a tin plasma source at a power of more than 50 W with a low hydrogen partial pressure in order to avoid excessively great growth of tin contamination. It is assumed that the functional layer configured as a microstructured layer and composed of tin or in particular of tin oxide or tin nitride can lead to a reduction of the hydrogen concentration in atom % at the side of the substrate facing the reflective coating by a factor of up to more than 100.

A similar assumption is made for mirrors for grazing incidence that comprise as reflective coating, for example, a ruthenium layer having a thickness of a few hundred nanometers on a polishing layer composed of amorphous silicon and likewise having a thickness of a few to a few hundred nanometers. Additionally arranged underneath on an aluminum substrate, for example, is a functional layer configured as a microstructured layer having a spectral filter function, said functional layer comprising preferably tin, tin nitride or particularly preferably tin oxide with a thickness of a few to a few hundred micrometers. It is assumed that this functional layer configured as a microstructured layer and composed of tin, tin nitride or tin oxide can also lead to a reduction of the hydrogen concentration in atom % at the side of the substrate facing the reflective coating by a factor of up to more than 100.

For mirrors, too, which comprise a functional layer having a thickness of only a few tens of nanometers in accordance for instance with the construction discussed in conjunction with FIG. 2, a measurable reduction of the hydrogen concentration in atom % at the side of the substrate facing the reflective coating is expected, specifically by a factor of at least 5. Said factor can also be above 10 or even above 50. Particular preference is given to functional layers composed of tin and in particular tin oxide or tin nitride. However, even in the case of mirrors having a functional layer comprising other materials from among those of the group tin, silver, molybdenum, ruthenium, iridium, nickel, iron, cobalt, copper, aluminum, platinum, zinc, manganese, lead oxides, borides, nitrides and carbides thereof, comparable results can be expected. This also applies to functional layers embodied as a microstructured layer.

In further variants, in particular having a construction corresponding approximately to the construction discussed in conjunction with FIGS. 4 to 6, a significant reduction of the hydrogen concentration in atom % at the side of the substrate facing the reflective coating by a factor of 2 or greater can be achieved with a functional coating composed of preferably silver, gold, copper, platinum, aluminum, aluminum oxide, iron, iron-nickel-cobalt alloys, palladium, tungsten and/or tantalum oxide. In this case, the functional layer can have a thickness of 1 μm or more in order to be able to ensure in particular the compensation of unevennesses in the substrate or the microstructured layer, and also a closed layer. To that end, the functional layer can preferably be applied electrolytically, in a plasma-enhanced manner or by thermal or ion-based evaporation.

REFERENCE SIGNS

10 EUV lithography apparatus
12 EUV radiation source
13 collector mirror
14 illumination system
15 first mirror
16 second mirror
17 mask
18 third mirror
19 fourth mirror
20 projection system
21 wafer
50 collector mirror
51 substrate
52 polishing layer
53 protective layer
54 multilayer system
55 pair of plies
56 absorber
57 spacer
58 microstructured layer
58' microstructured sublayer
58" sublayer
59 adhesion promoter layer
60 functional layer
61 functional layer configured as microstructured layer

What is claimed is:

1. A reflective optical element for extreme ultraviolet (EUV) lithography, comprising:
    a substrate and a reflective coating configured to reflect radiation in a wavelength range of 5 nm to 20 nm;
    a functional layer arranged between the reflective coating and the substrate, wherein the functional layer reduces a concentration of hydrogen in atom % at a side of the substrate facing the reflective coating by at least a factor of 2;
    a microstructured layer arranged between the reflective coating and the substrate;
    a polishing layer arranged on the functional layer or on the microstructured layer; and
    an adhesion promoter layer arranged on the substrate.

2. The reflective optical element as claimed in claim 1, wherein the functional layer comprises at least one of: tin, silver, molybdenum, ruthenium, iridium, nickel, iron, cobalt, copper, aluminum, platinum, zinc, manganese, lead, gold, palladium, tungsten, tantalum, and alloys, oxides, borides, and nitrides or carbides thereof.

3. The reflective optical element as claimed in claim 1, wherein the microstructured layer comprises at least one of: nickel-phosphorus, nickel-boron, copper, silver, gold, platinum, iridium, tantalum, titanium, zirconium, tungsten, molybdenum and niobium.

4. The reflective optical element as claimed in claim 1, wherein the functional layer is arranged between the reflective coating and the microstructured layer and/or between the microstructured layer and the substrate and/or within the microstructured layer and wherein the functional layer comprises at least one of tin, tin oxide, or tin nitride.

5. The reflective optical element as claimed in claim 1, wherein the polishing layer is arranged on the functional layer.

6. The reflective optical element as claimed in claim 1, wherein the polishing layer comprises at least one of: amorphous silicon, silicon dioxide, silicon nitride, gallium nitride and aluminum nitride.

7. The reflective optical element as claimed in claim 1, wherein the functional layer is arranged between the polishing layer and the reflective coating.

8. The reflective optical element as claimed in claim 1, wherein the substrate comprises at least one of: silicon, silicon carbide, silicon-infiltrated silicon carbide, quartz glass, titanium-doped quartz glass, glass, and glass ceramic.

9. The reflective optical element as claimed in claim 1, wherein the adhesion promoter layer comprises at least one ply and further comprises at least one of:
    ruthenium, chromium, platinum, iridium, copper, silver, gold, nickel, nickel-phosphorus, tantalum, titanium, zirconium, tungsten, molybdenum, and niobium.

10. The reflective optical element as claimed in claim 1, wherein the reflective coating is configured as a multilayer system comprising alternately arranged layers of a material having a lower real part of a refractive index at an operating wavelength in the wavelength range of between 5 nm and 20 nm and of a material having a higher real part of the refractive index at the operating wavelength in the wavelength range of between 5 nm and 20 nm.

11. The reflective optical element as claimed in claim 1, configured as a collector mirror.

12. An optical system for an EUV lithography apparatus having a reflective optical element as claimed in claim 1.

13. An EUV lithography apparatus having the optical system as claimed in claim 12.

14. The reflective optical element as claimed in claim 1, wherein the functional layer is arranged between a first sublayer of the microstructured layer and a second sublayer of the microstructured layer.

15. The reflective optical element as claimed in claim 1, wherein the functional layer has at least 100 micrometers thickness.

16. The reflective optical element as claimed in claim 1, wherein the polishing layer is arranged above the microstructured layer and below the functional layer.

17. The reflective optical element as claimed in claim 1, wherein:
    the adhesion promoter layer is arranged on the substrate and below the microstructured layer; and
    the polishing layer is arranged above the microstructured layer.

18. A reflective optical element for extreme ultraviolet (EUV) lithography, comprising:
    a substrate and a reflective coating configured to reflect radiation in a wavelength range of 5 nm to 20 nm;
    a functional layer that reduces a concentration of hydrogen in atom % at a side of the substrate facing the reflective coating by at least a factor of 2, wherein the functional layer comprises at least one of: tin, silver, molybdenum, ruthenium, iridium, iron, cobalt, aluminum, platinum, manganese, lead, gold, palladium, tungsten, tantalum, and alloys, oxides, borides, and nitrides or carbides thereof; and a microstructured layer arranged between the reflective coating and the substrate, wherein the functional layer is arranged between the reflective coating and the microstructured layer.

* * * * *